United States Patent [19]
Katoh et al.

[11] Patent Number: 5,850,166
[45] Date of Patent: Dec. 15, 1998

[54] PIEZOELECTRIC CERAMIC FILTER CIRCUIT AND PIEZOELECTRIC CERAMIC FILTER

[75] Inventors: Ikuo Katoh; Tsuyoshi Momiyama, both of Tokyo, Japan

[73] Assignee: TDK Corporation, Tokyo, Japan

[21] Appl. No.: 792,709

[22] PCT Filed: Jul. 5, 1993

[86] PCT No.: PCT/JP93/00922

§ 371 Date: Jan. 9, 1995

§ 102(e) Date: Jan. 9, 1995

[87] PCT Pub. No.: WO94/01931

PCT Pub. Date: Jan. 20, 1994

Related U.S. Application Data

[63] Continuation-in-part of Ser. No. 694,183, Aug. 8, 1996, abandoned, which is a continuation of Ser. No. 362,488, Jan. 9, 1995, abandoned.

[30] Foreign Application Priority Data

Jul. 7, 1992 [JP] Japan ..................................... 4-203049

[51] Int. Cl.⁶ .............................. H03H 9/205; H03H 9/56
[52] U.S. Cl. .......................... 333/189; 333/191; 310/320; 310/312; 310/367
[58] Field of Search .................................... 333/186–192, 333/320; 310/328, 312, 331, 367

[56] References Cited

U.S. PATENT DOCUMENTS

| | | | |
|---|---|---|---|
| 3,676,724 | 7/1972 | Berlincourt et al. | 333/187 |
| 3,838,366 | 9/1974 | Coussot | 333/192 |
| 3,866,155 | 2/1975 | Kobayashi et al. | |
| 4,066,986 | 1/1978 | Takano et al. | 333/187 |
| 4,196,407 | 4/1980 | Masaie et al. | 333/191 |
| 4,511,202 | 4/1985 | Kasai | 333/189 |

FOREIGN PATENT DOCUMENTS

| | | |
|---|---|---|
| 56-24820 | 3/1981 | Japan . |
| 0012810 | 1/1983 | Japan . |
| 0014511 | 1/1987 | Japan . |

*Primary Examiner*—Robert Pascal
*Assistant Examiner*—Barbara Summons
*Attorney, Agent, or Firm*—Oblon, Spivak, McClelland, Maier & Neustadt, P.C.

[57] ABSTRACT

Multiple piezoelectric ceramic filter elements have different center frequencies from each other and are cascade connected together. The piezoelectric ceramic filter elements satisfy the condition $0<|dF_0|/BW_3<0.8$; where $|dF_0|$ is the absolute value of the frequency difference $dF_0$ between the center frequencies, and $BW_3$ is the band width of each piezoelectric ceramic filter element in which the amplitude loss is 3 dB or less. A low insertion loss and an improvement in the group delay characteristics are compatible at the same time.

7 Claims, 5 Drawing Sheets

PIEZOELECTRIC CERAMIC FILTER CIRCUIT AND PIEZOELECTRIC CERAMIC FILTER

This application is a Continuation-in-Part of application Ser. No. 08/694,183, filed on Aug. 8, 1996, now abandoned which is a Continuation of application Ser. No. 08/362,488, filed on Jan. 9, 1995, now abandoned which was filed as PCT application PCT/JP93/00922 on Jul. 5, 1993.

TECHNICAL FIELD

The present invention relates to a piezoelectric ceramic filter circuit and a piezoelectric ceramic filter.

BACKGROUND ART

Piezoelectric ceramic filters of this type are used, for example, as IF filters in various mobile communication devices and FM sound multiplex receivers. To date, the following types of piezoelectric ceramic filter circuits are well known: multistage type piezoelectric ceramic filter circuits and ceramic filters with trapped energy type multiple mode piezoelectric resonators having approximately the same center frequencies connected in cascade.

Insertion loss and group delay characteristics are important factors in piezoelectric ceramic filter circuits and piezoelectric ceramic filters. The insertion loss must be maintained at a low level in order to hold down signal attenuation through filtering. It is desirable that the group delay characteristics are as flat as possible within the pass band so that transmission time difference depending on frequency will not be created in the signal transmission within the pass band. Since piezoelectric ceramic filters are minimum phase shift devices, it is not possible to control the amplitude characteristics and the group delay characteristics independently. Previous attempts, therefore, to improve the group delay characteristics have been limited to keeping the mechanical quality factor Q of the piezoelectric resonator as low as possible.

However, with the prior art, wherein the group delay characteristics are improved by keeping the mechanical quality factor Q of the piezoelectric resonator low, the amplitude characteristics degrade and the insertion loss becomes extremely large, resulting in lowered filter transmission efficiency. In order to lower the insertion loss, Q must be high, thereby degrading the group delay characteristics. In other words, with the prior art, it has been difficult to improve the insertion loss and the group delay characteristics at the same time.

DISCLOSURE OF THE INVENTION

It is the object of the present invention to provide a piezoelectric ceramic filter circuit and a piezoelectric ceramic filter, wherein lowered insertion loss and improved group delay characteristics can be realized at the same time.

In order to achieve the afore-mentioned object, the piezoelectric ceramic filter circuit according to the present invention comprises a plurality of piezoelectric ceramic filter elements connected in cascade with each other, of which at least two piezoelectric ceramic filter elements have different center frequencies and satisfy the condition $0<|dF_0|/BW_3<0.8$.

Here $|dF_0|$ is the absolute value of the frequency difference $dF_0$ between the center frequencies of said piezoelectric ceramic filter elements, and $BW_3$ is the individual band width of each of the ceramic filter elements in which the amplitude loss is 3 dB.

Also, the piezoelectric ceramic filter according to the present invention has a plurality of trapped energy type filter elements on the same piezoelectric ceramic substrate. At least two of these trapped energy type filter elements have different center frequencies, are connected in cascade and satisfy the condition $0<|dF_0|/BW_3<0.8$.

Here $|dF_0|$ is the absolute value of the frequency difference $dF_0$ between the center frequencies of said trapped energy type ceramic filter elements, and $BW_3$ is the individual band width of each of the ceramic filter elements in which the amplitude loss is 3 dB.

Since at least two of the piezoelectric ceramic filter elements have different center frequencies and since they are connected in cascade with each other, it is possible, depending upon the selected center frequencies, to synthesize the group delay characteristics of the multi-type piezoelectric ceramic filter circuit and to obtain total stage group delay characteristics which are flat within the pass band.

Especially with a piezoelectric ceramic filter circuit that satisfies the condition $0<|dF_0|/BW_3<0.8$, where $|dF_0|$ is the absolute value of the frequency difference $dF_0$ between the center frequencies of said piezoelectric ceramic filter elements, and $BW_3$ is the band width of each ceramic filter element in which the amplitude loss is 3 dB, the total stage group delay characteristics are largely flattened in the pass band.

In addition, unlike the method of the prior art to control the group delay characteristics by keeping the mechanical quality factor Q low, the piezoelectric ceramic filter circuit of the present invention does not increase the insertion loss.

When the above-mentioned concept of the present invention is applied to a piezoelectric ceramic filter that has trapped energy type filter elements on the same piezoelectric substrate, it is possible to make the filter more compact than a piezoelectric ceramic filter circuit that uses separate piezoelectric ceramic filters.

Moreover, it becomes possible to obtain a piezoelectric ceramic filter wherein the total stage group delay characteristics are very flat within the pass band without increasing the insertion loss.

BRIEF DESCRIPTION OF THE DRAWINGS

A more complete appreciation of the invention and many of the attendant advantages thereof become better understood when refering to the following detailed describtion of the accompanied drawings, wherein.

BEST MODE OF CARRYING OUT OF THE INVENTION

Figure 1:
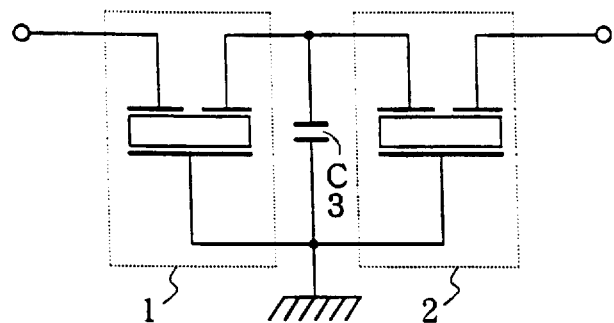
FIG. 1 is a schematic electrical diagram of the piezoelectric ceramic filter circuit of the present invention.

FIG. 1 shows the piezoelectric ceramic filter circuit comprising two piezoelectric ceramic filter elements (1) and (2) which are cascade connected via a coupling capacitor (3).

Piezoelectric ceramic filter element (1) has a center frequency $F_{01}$, and piezoelectric ceramic filter element (2) has a center frequency $F_{02}$ which is different from the center frequency $F_{01}$.

Piezoelectric ceramic filter element (1) satisfies the condition $0<|dF_{01}|/BW_3<0.8$; where the absolute value of the center frequency difference $dF_0$ between center frequencies $F_{01}$ and $F_{02}$ is $|dF_0|=|F_{02}-F_{01}|$, and $BW_3$ is the band width of each of the piezoelectric ceramic filter elements wherein the amplitude loss is 3 dB based on the maximum value of the amplitude characteristics.

Piezoelectric ceramic filter element (2) satisfies the condition $0<|dF_0|/BW_3<0.8$; where the absolute value of the center frequency difference $dF_0$ between center frequencies $F_{01}$ and $F_{02}$ is $|dF_0|=|F_{02}-F_{01}|$, and $BW_3$ is the band width wherein the amplitude loss is 3 dB based on the maximum value of the amplitude characteristics A.

Figure 2:
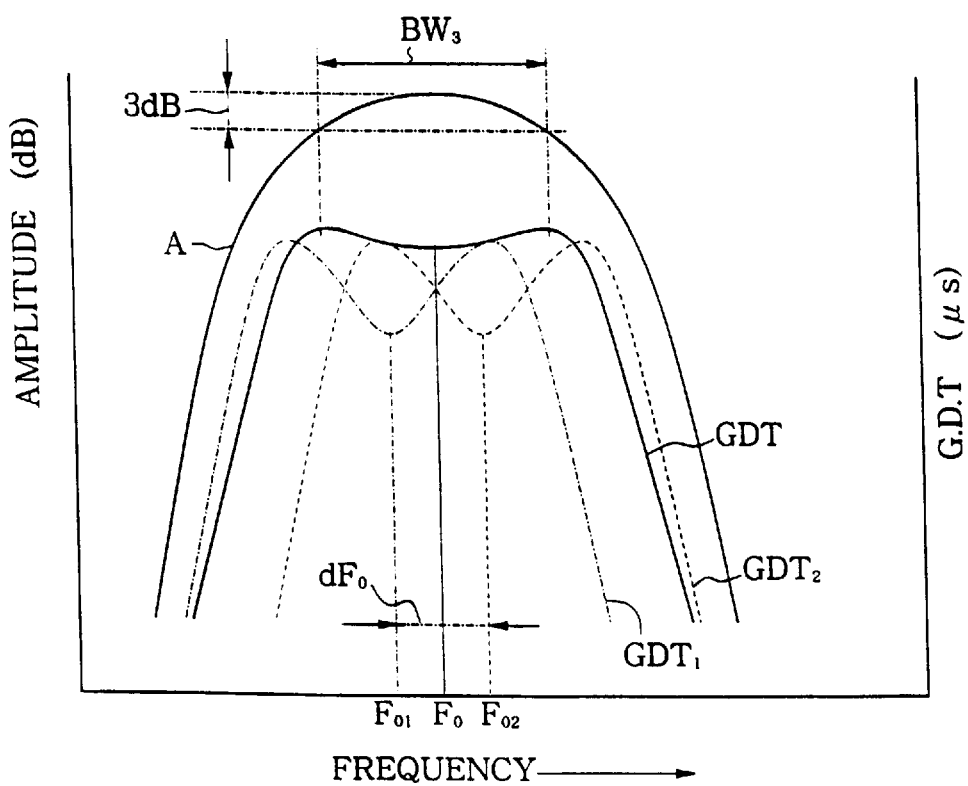
FIG. 2 is a graph showing the relationship between the frequency and the group delay time, and the relationship between the frequency and the amplitude loss in each individual piezoelectric ceramic filter circuit.

As mentioned above, since piezoelectric ceramic filter elements (1) and (2) have different center frequencies, $F_{01}$ and $F_{02}$, respectively, and since they are cascade connected to each other, it is possible to flatten the total stage group delay characteristics of each piezoelectric ceramic filter element within the pass band, as shown in FIG. 2, by selecting the center frequencies.

Specifically, when the absolute value $|dF_0|$ of the frequency difference $dF_0$ between the center frequencies is represented by $0<|dF_0|/BW_3<0.8$, the group delay characteristics of piezoelectric ceramic filter elements (1) and (2), which are cascade connected and are combined together, result in extremely flat total stage group delay characteristics within the band width.

Moreover, unlike the conventional method of the prior art to control the group delay characteristics by keeping the mechanical quality factor Q low, the technology of the present invention does not increase the insertion loss.

FIG. 2 illustrates that the group delay characteristics of each the piezoelectric ceramic filter element becomes flat when a particular center frequency difference is selected. In the FIG. 2, the horizontal axis represents frequency (MHz), the left vertical axis represents amplitude (dB) and the right vertical axis represents the G.D.T.(Group Delay Time)($\mu$s).

As shown, each the group delay characteristics $GDT_1$ of a piezoelectric ceramic filter element in which the center frequency is $F_{01}$ and the group delay characteristics $GDT_2$ of a piezoelectric ceramic filter element in which the center frequency is $F_{02}$, are combined so that their wave forms interfere. Because of this, the flat group delay characteristics GDT can be obtained. Below, further explanation is given by citing actual measured data.

Figure 3:
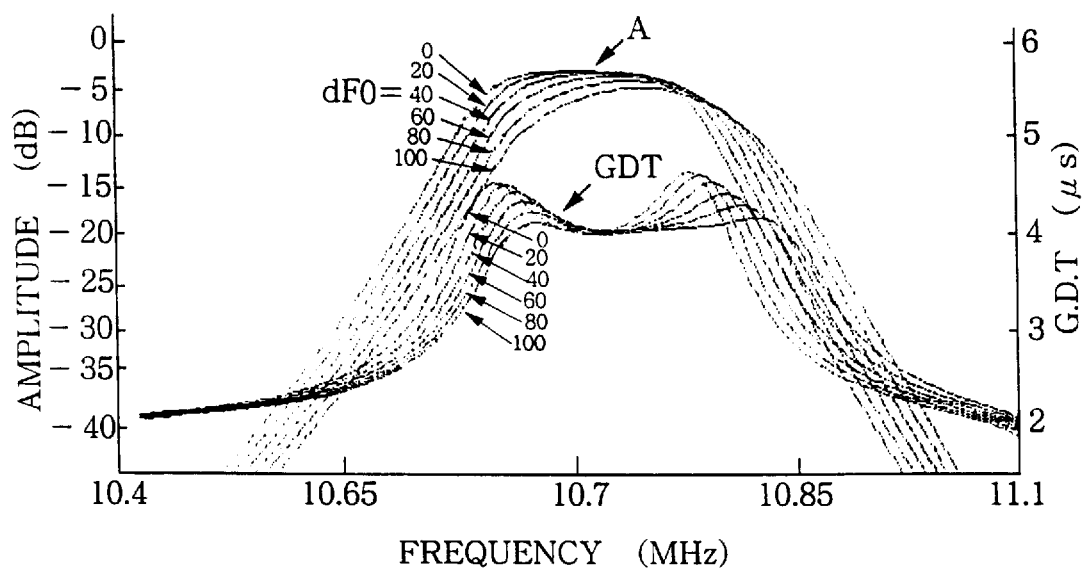
FIG. 3 is a graph showing the relationships between piezoelectric ceramic filter element of the piezoelectric ceramic filter circuit frequencies, the group delay characteristics (with frequency difference $dF_0$ used as a parameter) and the amplitude loss.

FIG. 3 shows each frequency-amplitude relationship A and the group delay characteristics when the center frequency difference $dF_0$ between center frequencies $F_{01}$ and $F_{02}$ of piezoelectric ceramic filter elements (1) and (2) respectively, is set at 0, 20, 40, 60, 80 and 100 (kHz). The horizontal axis represents frequency (MHz), the left vertical axis represents amplitude (dB) and the right vertical axis represents G.D.T. (Group Delay Time)($\mu$s).

As can be seen, when the center frequency difference $dF_0$ is 60 kHz ($|dF_0|/BW_3=0.33$), the total stage group delay characteristics GDT are more flattened than when the center frequency difference $dF_0$ is 0 kHz ($|dF_0|/BW_3=0$).

Furthermore, when the center frequency difference $dF_0$ is 100 (kHz) ($|dF_0|/BW_3=0.55$) the total stage group delay characteristics are even more flattened than when center frequency difference is $dF_0$ is 60 kHz. Unlike the conventional method to control the group delay characteristics that keeps the mechanical quality factor Q low, insertion loss with the present invention does not increase.

Figure 4:
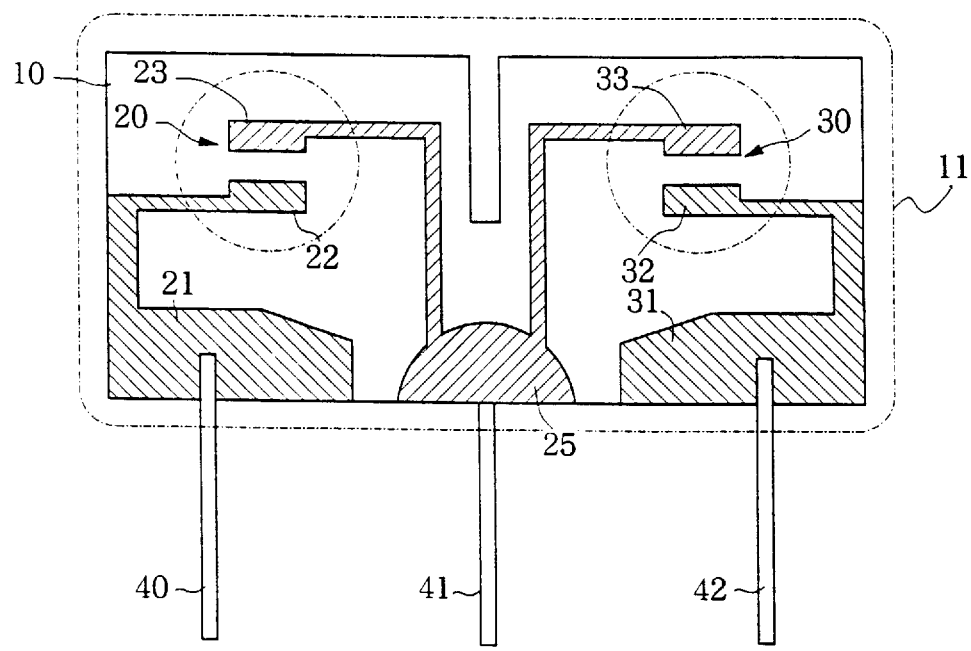
FIG. 4 is a plan view of the trapped energy type piezoelectric ceramic filter of the present invention.

FIG. 4 shows a plan view of a trapped energy type piezoelectric ceramic filter which comprises a pair of piezoelectric ceramic filter elements formed on the same piezoelectric substrate.

Figure 5:
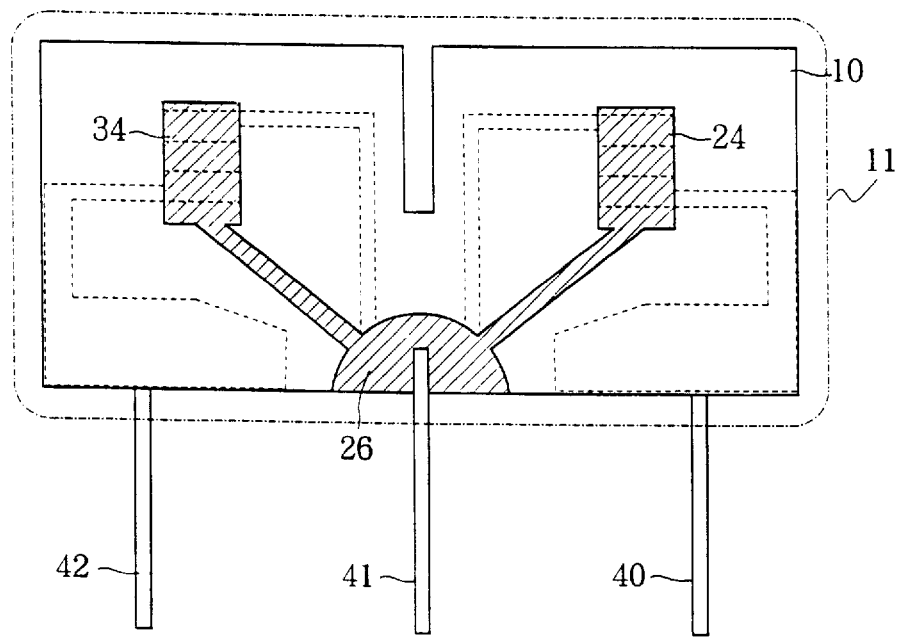
FIG. 5 is the bottom view of the piezoelectric ceramic filter shown in FIG. 4.

FIG. 5 shows a bottom view of the piezoelectric ceramic filter shown in FIG. 4. In these FIGS., (10) indicates a piezoelectric ceramic substrate. (11) indicates a sheathing made of insulating resin. (20) and (30) indicate filter elements. (21) and (31) indicate connecting electrodes. (22) and (32), and (23) and (33) indicate drive electrodes. (24) and (34) indicate common electrodes. (25) indicates a capacitor electrode. (26) indicates a ground electrode and (40), (41) and (42) indicate lead terminals.

Filter element (20) has a center frequency $F_{01}$, and filter element (30) has a center frequency $F_{02}$ which is different from the center frequency $F_{01}$. Filter element (20) satisfies the condition $0<|dF_0|/BW_3<0.8$;

where the absolute value of the frequency difference $dF_0$ between the center frequency $F_{01}$ and center frequency $F_{02}$ is $|dF_0=|F_{02}-F_{01}|$, and $BW_3$ is the band width of each filter element in which the amplitude loss is 3 dB based on the maximum value of the individual amplitude characteristics. Filter element (30) satisfies the condition $0<|dF_0|/BW_3<0.8$;

where the absolute value of the frequency difference $dF_0$ between the center frequency $F_0$, and center frequency $F_{02}$ is $|dF_0|=|F_{02}-F_{01}|$, and $BW_3$ is the band width wherein the amplitude loss is 3 dB based on the maximum value of the amplitude characteristics.

When the above-mentioned concept of the present invention is applied to a piezoelectric ceramic filter that has trapped energy type filter elements on the same piezoelectric substrate, it is possible to make the filter more compact than a piezoelectric ceramic filter circuit that uses separate piezoelectric ceramic filters. Moreover, the total stage group delay characteristics can be very flat within the pass band without increasing the insertion loss.

Figure 6:
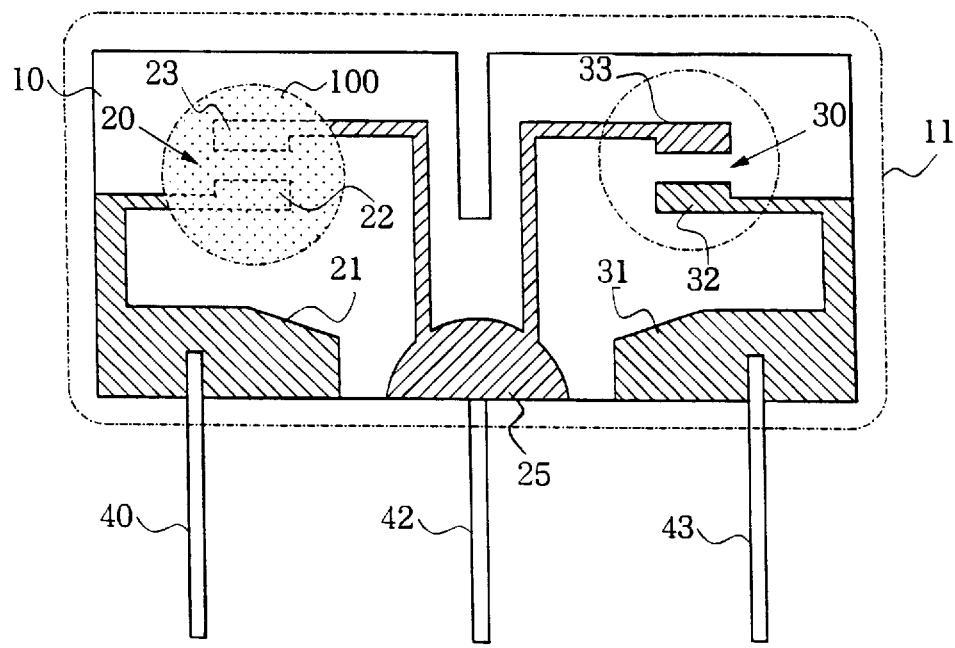
FIG. 6 is a plan view of a different embodiment of the piezoelectric ceramic filter of the present invention.

FIG. 6 shows the piezoelectric ceramic filter in which one of the filter elements is coated with an insulating substance. The same reference numerals as in FIGS. 4 and 5 indicate the components in common. Reference numeral (100) is an insulating substance.

As shown, an filter element (20) that is coated with the insulating substance (100), has a lowered center frequency $F_{01}$ due to the mass load. Therefore, the center frequency difference $dF_0$ will be generated between center frequency $F_{01}$ of filter element (20) and center frequency $Fo_2$ of another filter element (30) which unlike filter element (20), is not coated with the insulating substance. Therefore, by selecting the center frequency difference $dF_0$, based on the difference of mass loads, the total stage group delay characteristics GDT are flattened.

Figure 7:
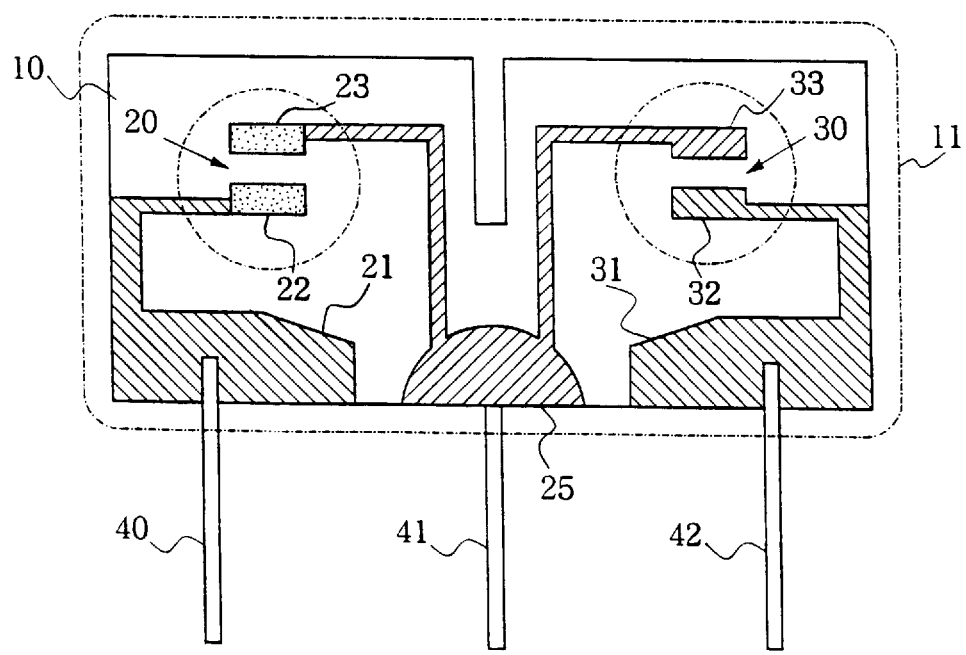
FIG. 7 is a plan view of yet another embodiment of the piezoelectric ceramic filter of the present invention.

FIG. 7 shows a 2-element type piezoelectric ceramic filter in which a mass load is applied by creating a difference in electrode film thickness between the filter elements.

As can be seen, filter element (20) with drive electrodes (22) and (23) which have thicker films, is subject to a larger mass load than filter element (30) with drive electrodes (32) and (33) which have thinner films, resulting in a lower center frequency $F_{O1}$. Therefore, the center frequency difference $dF_0$ is generated between filter element (20) with drive electrodes (22) and (23) which have thicker films, and filter element (30) with drive electrodes (32) and (33) which have thinner films. By selecting the center frequency difference $dF_0$, the total stage group delay characteristics GDT can be flattened.

Figure 8:
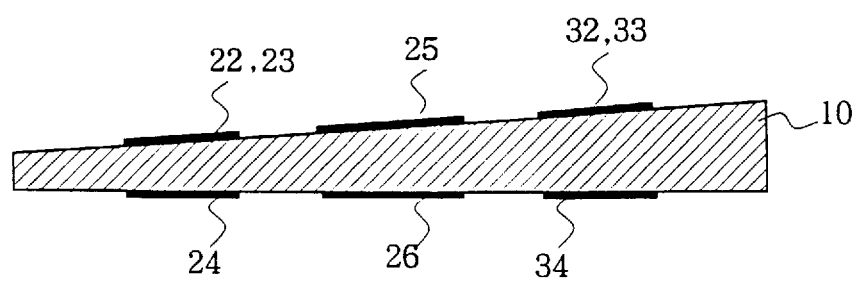
FIG. 8 is a cross sectional view of yet another embodiment of the piezoelectric ceramic filter of the present invention.

FIG. 8 shows a piezoelectric ceramic filter in which the thickness of the piezoelectric ceramic substrate is different at the two filter elements. As the resonant frequency of the piezoelectric ceramic substrate is in reverse proportion to its thickness, the center frequency difference $dF_0$ is generated between center frequency $F_{O1}$ of filter element (20) where the piezoelectric ceramic substrate is thin, and center frequency $F_{O2}$ of filter element (30) where the piezoelectric ceramic substrate is thick. Depending upon the selected center frequency difference $dF_0$ based upon this difference in thickness, the total stage group delay characteristics GDT is flattened.

INDUSTRIAL APPLICABILITY

As has been described above, the following effects can be obtained with the present invention:

(a) Unlike the conventional methods for controlling the group delay characteristics that require the mechanical quality factor Q to be kept low, the present invention can provide a piezoelectric ceramic filter circuit wherein the group delay characteristics can be flattened within the pass band without increasing the insertion loss.

(b) The present invention can provide a more compact piezoelectric ceramic filter than that of the prior art in which a piezoelectric ceramic filter circuit is structured by using separate piezoelectric ceramic filters.

We claim:

1. A piezoelectric ceramic filter circuit comprising a plurality of piezoelectric ceramic filter elements, wherein at least two of said piezoelectric ceramic filter elements have center frequencies different from each other, and are connected in cascade with each other, and satisfy the condition $0<|dF_0|/BW_3<0.8$; where $|dF_0|$ is the absolute value of the frequency difference $dF_0$ between the center frequencies of said at least two of said piezoelectric ceramic filter elements, and $BW_3$ is the individual pass band width of each of said at least two piezoelectric ceramic filter circuit elements in which the amplitude loss is 3 dB or less.

2. The piezoelectric ceramic filter circuit according to claim 1, wherein said piezoelectric ceramic filter elements are formed on the same piezoelectric ceramic substrate.

3. A piezoelectric ceramic filter comprising a plurality of trapped energy type ceramic filter elements on the same piezoelectric ceramic substrate, wherein at least two of said trapped energy type ceramic filter elements have different center frequencies and are connected in cascade with each other, and satisfy the condition $0<|dF_0|/BW_3<0.8$; where $|dF_0|$ is the absolute value of the frequency difference $dF_0$ between the center frequencies of said at least two of said trapped energy type ceramic filter elements, and $BW_3$ is the individual pass band width of each of said at least two trapped energy type ceramic filter circuit elements in which the amplitude loss is 3 dB or less.

4. The piezoelectric ceramic filter according to claim 3, wherein said trapped energy type ceramic filter elements have different mass loads.

5. The piezoelectric ceramic filter according to claim 4, wherein said mass loads on said trapped energy type ceramic filter elements comprise a coating of insulating substance.

6. The piezoelectric ceramic filter according to claim 4, wherein said mass loads on said trapped energy type ceramic filter elements are effectuated by a difference in film thickness of the electrodes.

7. The piezoelectric ceramic filter according to claim 3, wherein the thickness of the piezoelectric ceramic substrate for each of said trapped energy type ceramic filter elements is different.

* * * * *